(12) United States Patent
Guitart et al.

(10) Patent No.: US 9,490,372 B2
(45) Date of Patent: Nov. 8, 2016

(54) METHOD OF FORMING A SEMICONDUCTOR DEVICE TERMINATION AND STRUCTURE THEREFOR

(75) Inventors: Jaume Roig Guitart, Oudenaarde (BE); Peter Moens, Zottegem (BE); Zia Hossain, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 889 days.

(21) Appl. No.: 13/227,011

(22) Filed: Sep. 7, 2011

(65) Prior Publication Data

US 2012/0187527 A1 Jul. 26, 2012

Related U.S. Application Data

(63) Continuation-in-part of application No. 13/011,590, filed on Jan. 21, 2011, now abandoned.

(51) Int. Cl.

| H01L 29/06 | (2006.01) |
|---|---|
| *H01L 29/872* | (2006.01) |
| *H01L 21/761* | (2006.01) |
| H01L 29/40 | (2006.01) |
| H01L 29/739 | (2006.01) |
| H01L 29/74 | (2006.01) |

(52) U.S. Cl.
CPC .......... *H01L 29/872* (2013.01); *H01L 21/761* (2013.01); *H01L 29/0634* (2013.01); *H01L 29/0615* (2013.01); *H01L 29/0619* (2013.01); *H01L 29/402* (2013.01); *H01L 29/7395* (2013.01); *H01L 29/74* (2013.01)

(58) Field of Classification Search
CPC .......... H01L 29/0615; H01L 29/0619; H01L 29/0634; H01L 21/761
USPC .......... 257/339, 341, 342, 343, 509
See application file for complete search history.

(56) References Cited

U.S. PATENT DOCUMENTS

| 6,204,097 B1 | 3/2001 | Shen et al. |
|---|---|---|
| 6,274,904 B1 | 8/2001 | Tihanyi |
| 6,300,171 B1 | 10/2001 | Frisina |
| 6,621,122 B2 | 9/2003 | Qu |
| 6,639,260 B2 | 10/2003 | Suzuki et al. |
| 6,674,126 B2 | 1/2004 | Iwamoto et al. |
| 6,677,626 B1 | 1/2004 | Shindou et al. |
| 6,982,193 B2 | 1/2006 | Hossain et al. |
| 7,176,524 B2 | 2/2007 | Loechelt et al. |
| 7,253,477 B2 | 8/2007 | Loechelt et al. |
| 7,285,823 B2 | 10/2007 | Loechelt et al. |
| 7,411,266 B2 | 8/2008 | Tu et al. |
| 7,655,981 B2 | 2/2010 | Lee et al. |
| 7,759,204 B2 | 7/2010 | Hshied et al. |
| 7,943,989 B2* | 5/2011 | Yilmaz et al. ................ 257/329 |
| 2005/0176192 A1* | 8/2005 | Hshieh ........................ 438/197 |
| 2010/0317158 A1 | 12/2010 | Yilmaz et al. |

OTHER PUBLICATIONS

L. Theolier et al., "A new junction termination technique: the Deep Trench Termination (DT2)", ISPSD'2007, pp. 176-179.

\* cited by examiner

*Primary Examiner* — Ori Nadav
(74) *Attorney, Agent, or Firm* — Robert F. Hightower (57) ABSTRACT

At least one embodiment is directed to a semiconductor edge termination structure, where the edge termination structure comprises several doped layers and a buffer layer.

15 Claims, 9 Drawing Sheets

METHOD OF FORMING A SEMICONDUCTOR DEVICE TERMINATION AND STRUCTURE THEREFOR

This application is a continuation-in-part of U.S. patent application Ser. No. 13/011,590 filed on Jan. 21, 2011 now abandoned having common inventors and a common assignee, which is hereby incorporated herein by reference in its entirety.

BACKGROUND

The present invention relates in general, to electronics, and more particularly though not exclusively, to semiconductors, structures thereof, and methods of forming semiconductor devices.

Two major parameters which are important to the high voltage power switch market are breakdown voltage (BV) and on-state resistance (RS). In typical systems a high breakdown voltage is desired. However, this is often at the expense of high RS. A trade-off in performance which accompanies balancing a high breakdown voltage and a high RS is a major design challenge for manufacturers of high voltage power switching devices. An edge termination structure that surrounds a semiconductor device, aids in the reduction of electric fields at the edge of the semiconductor device (edge electric fields). Common edge termination structures are based upon floating rings and field plates, where the edge electric fields reduce the voltage at the edge of the semiconductor device to about fifty to eighty percent (50%-80%) of the voltage without such edge termination structures.

Figure 1:
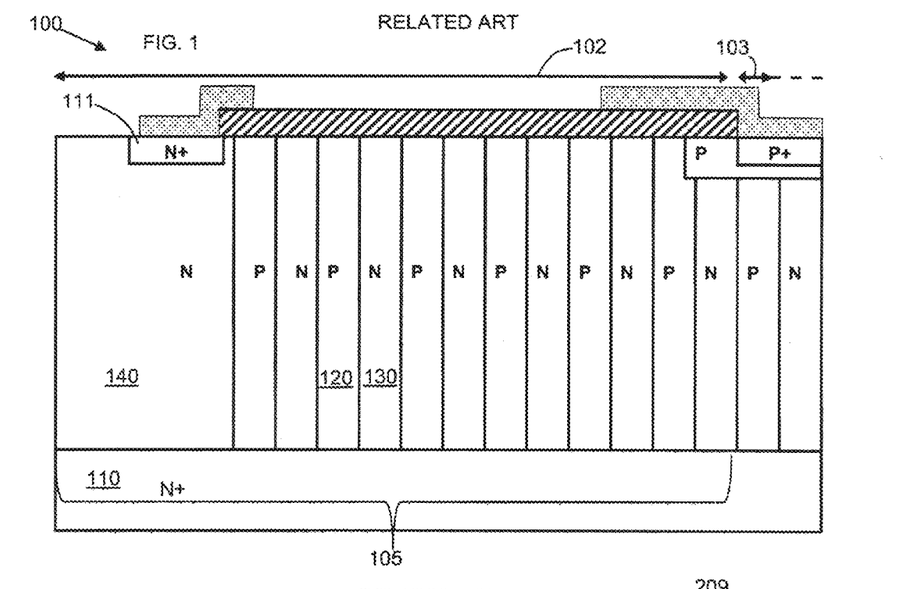
FIG. 1 illustrates a related art global charge balance (GCB) edge termination structure.

Recently, superjunction Global Charge Balance (GCB) termination devices have gained in popularity to improve the trade-off in performance when balancing desirable RS and BV values in a semiconductor device. FIG. 1 illustrates a common GCB termination structure. In the structure illustrated multiple heavily-doped diffused N-type (130) and P-type (120) pillars replace one lightly doped N-type epitaxial region. In the on state, current flows through the heavily doped N-type region (130), which lowers RS. In the off or blocking state, the heavily doped N-type (130) and P-type (120) pillars deplete into or compensate each other to provide a larger BV than a BV associated with the N-type epitaxial region alone. The termination area 102 of a semiconductor device 100 is illustrated in FIG. 1. An edge termination structure 105, includes P-type (120) and N-type (130) pillars, facilitating charge depletion across the termination structure 105. The edge termination structure 105 includes an N-channel stopper region 140 which is connected electrically via an N+ contact region 111 to an N+ drain contact region 110. Typical GCB based semiconductor devices have termination areas with a length dimension extending from the active region to an edge of the semiconductor device which generally is greater than about 200 μm. The larger the termination area and the length thereof, the larger the semiconductor device will be. Hence if the termination area can be reduced while maintaining a low edge electric field, the semiconductor device can be reduced in size.

Figure 2:
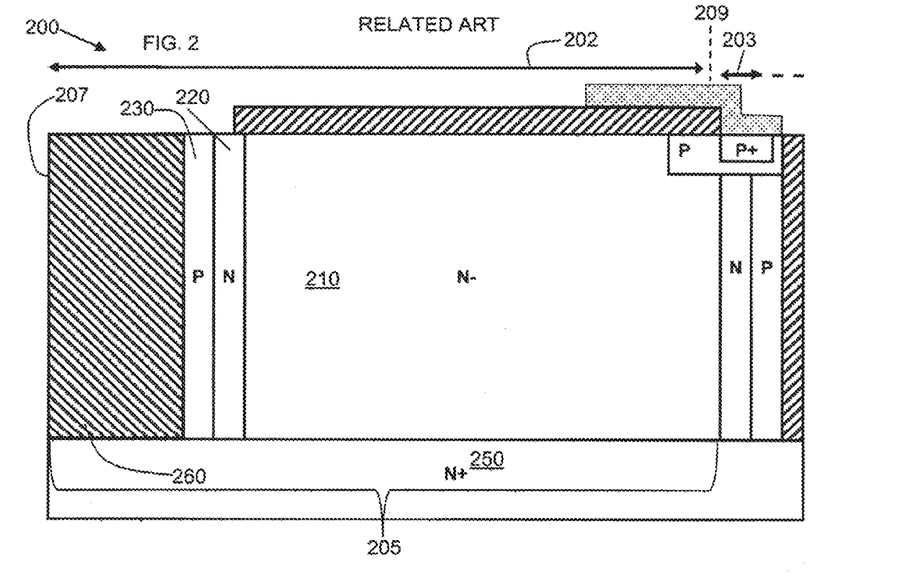
FIG. 2 illustrates a related art local charge balance (LCB) edge termination structure.

FIG. 2 illustrates a semiconductor device 200 including a Local Charge Balance (LCB) structure. The LCB edge termination structure 205 utilizes a wide oxide filled trench 260 adjacent to N-type (220) and floating P-type (230) pillars in a lightly doped epitaxial layer 210 deposited on an N+ drain contact region 250. The LCB edge termination structure 205 includes the lightly doped epitaxial layer 210, which the GCB method replaced with N-type (130) and P-type (120) doped pillars. The lowly doped epitaxial layer 210 ($<1\times10^{14}$ cm$^{-3}$) in LCB edge termination structures, facilitates rapid charge depletion and higher BV. However, when the length of the termination area, as measured from the edge of the active region 209 to the edge 207 of the semiconductor device 200, is reduced, the depletion region reaches the semiconductor edge, resulting in higher edge electric fields, which can damage connected devices. Thus the length of the termination area (termination length) would have to be increased to reduce edge electric fields, increasing the resultant semiconductor device size.

Some systems additionally use multi-ring termination structures in epitaxial layer 210. In multi-ring termination structures the depletion spreads slowly as each ring depletes, thus requiring 6 to 12 rings, resulting in a long termination length to achieve the desired BV.

Accordingly, an edge termination structure is needed that has a reduced termination area while minimizing edge electric fields at the edge of the semiconductor device. Additionally, an edge termination structure is needed that provides lower RS, and a high BV.

BRIEF DESCRIPTION OF THE DRAWINGS

Embodiments of present invention will become more fully understood from the detailed description and the accompanying drawings, wherein.

DETAILED DESCRIPTION

The following description of embodiment(s) is merely illustrative in nature and is in no way intended to limit the invention, its application, or uses.

For simplicity and clarity of the illustration(s), elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices may be explained herein as certain conductivity types such as N-type or P-type, or described as certain N-channel or P-Channel devices, or certain N-type or P-type doped regions, a person of ordinary skill in the art will appreciate that complementary devices are also possible. For example the regions can be of various conductivity types, such as N-type or P-type, and various values of resistivity or conductivity, such as N+, N−, P+, P−, N, and P, and can also be formed by other than doping processes as known by one of ordinary skill. Note that although the term pillar may be used hereinafter in the description, the term is general for example a pillar can refer to a layer seen in a cross-sectional view.

It will be appreciated by those skilled in the art that the words "during", "while", and "when" as used herein relating to circuit, operation are not exact, terms that mean an action takes place instantly upon an initiating action but that there may be some small but reasonable delay, such as a propagation delay, between the reaction that is initiated by the initial action. Additionally, the term "while" means that a certain action occurs at least within some portion of duration of the initiating action. The use of the word "approximately" or "substantially" means that a value of an element has a parameter that is expected to be close to a stated value or position. However, as is well known in the art there are always minor variances that prevent, the values or positions from being exactly as stated. It is well established in the art that variances of up to at least ten percent (10%) (and up to twenty percent (20%) for semiconductor doping concentrations) are reasonable variances from the ideal goal of exactly as described.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

Processes, techniques, apparatuses, and materials as known by one of ordinary skill in the art may not be discussed in detail but are intended to be part of the enabling description where appropriate. For example specific methods of semiconductor formation may not be listed for achieving each of the steps discussed; however one of ordinary skill would be able, without undo experimentation, to establish the steps using the enabling disclosure herein. For example, semiconductor structures can be formed by various processes including but not limited to deposition processes, removal processes, patterning processes, and processes that, modify the electrical properties. Non-limiting examples of deposition processes include physical vapor deposition (PVD), chemical vapor deposition (CVD), electrochemical deposition (ECD), molecular beam epitaxy (MBE) and atomic layer deposition (ALD). Removal processes include any process that removes material either in bulk or selectively, some non-limiting example of which are etch processes, either wet etching or dry etching and chemical-mechanical planarization (CMP). Patterning includes processes that shape or alter the existing shape of the deposited materials for example lithography. Modification of electrical properties includes doping. Non-limiting examples of doping processes can include rapid thermal annealing (RTA) and modification of dielectric constants in low-k insulating materials via exposure to ultraviolet light in UV processing (UVP).

As will be seen further hereinafter, for example in FIG. 3, FIG. 4, FIG. 5, FIG. 6, FIG. 7, FIG. 9, and FIG. 13, at least one embodiment is directed to an edge termination structure formed in a trench or recess, which can be formed by various methods known by one of ordinary skill. Thus, in accordance with at least one embodiment at least one semiconductor device can include filled trenches, semiconductor material filled trenches, epitaxially filled regions or trenches, charge compensating trench regions, deep trench charge compensation regions, and charge compensating filled trenches. The trenches can include a plurality of layers or multiple layers of semiconductor material, including layers of opposite conductivity type, which can be separated by a separator layer or a buffer layer or buffer region. The buffer layer functions, among other things, to reduce intermixing of the opposite conductivity type layers (i.e., the two charge layers), which can negatively impact the conduction efficiency of a semiconductor device in the on-state.

Figure 13:
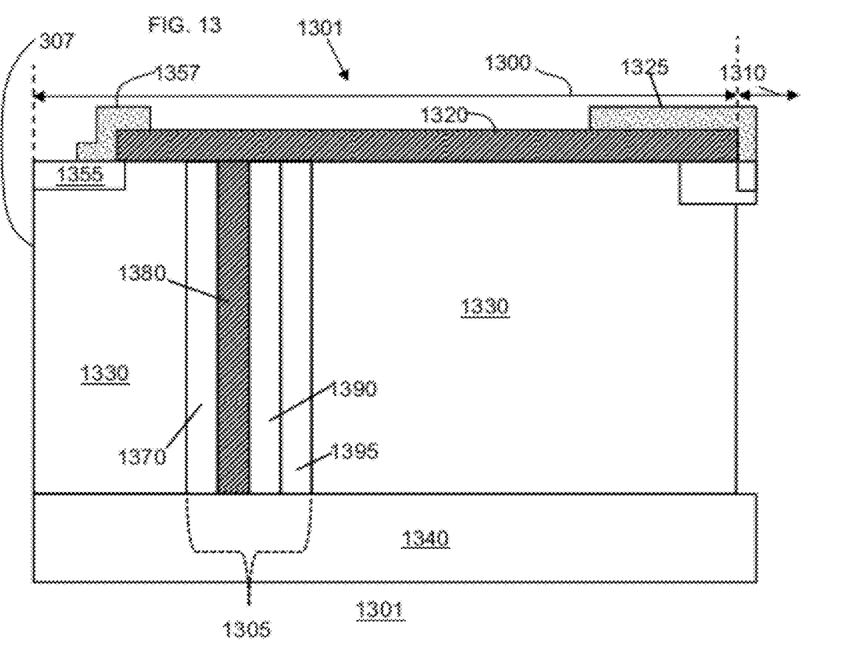
FIG. 13 illustrates an eleventh non-limiting example of an edge termination structure in accordance with at least one embodiment of the present invention.

At least one embodiment is directed to an edge termination structure that includes an NP-buffer-PN pillar-structure or an NP-buffer-N pillar structure (e.g., FIG. 13). These pillar structures sustain a significant part of the lateral electric potential drop in the termination structure (such as structure 1305 in FIG. 13) as well as reducing, and possibly terminating, the extension of the electric potential lines to the edge of the semiconductor device (for example edge 307 of FIG. 13). The low doped epitaxy semiconductor layer can block part, of the voltage with the pillar structure blocking the rest of the voltage, which stops the depletion from spreading in the lateral direction.

In at least one further embodiment the pillar structure of an edge termination structure in accordance with at least one embodiment can be combined with other structures to reduce the electric field at the termination side of the last active cell. For example several such structures include: (a)

field plate, (b) floating p-rings and (c) junction termination extension (JTE). Additionally at least one embodiment of an edge termination structure can be combined with any semiconductor device, for example IGBTs, Junction-Schottky diodes, Silicon-on-Insulator (SOI) devices, and Thyristors.

In at least one other embodiment, an imposed voltage of about 700V has a termination length less than about 100 μm, without high electric fields at the edge (for example edge 307 of FIG. 13) of the semiconductor device. Note that a system using GCB termination in a power MOSFET had a termination length of about 200 μm.

Figure 3:
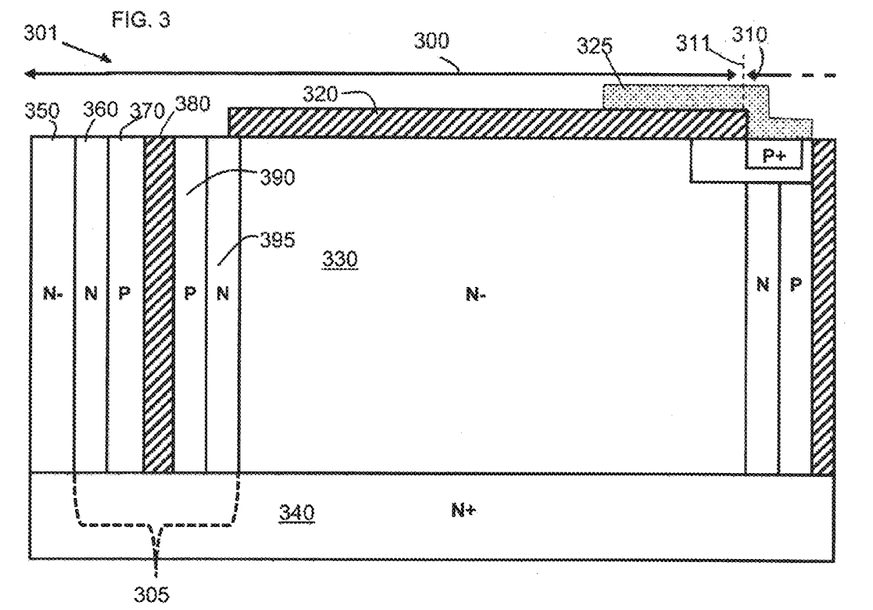
FIG. 3 illustrates a first non-limiting example of an edge termination structure in accordance with at least one embodiment of the present invention.

FIG. 3 illustrates a semiconductor device 301, including an edge termination structure 305 in a termination area 300 in accordance with at least one embodiment. Semiconductor device 301 comprises an active region 310 and a termination area 300. An edge 311 of the active region borders the termination area 300. The active region 310 includes a source electrode 325, contacting source active cells, which is in contact with a dielectric 320. In some embodiments, electrode 325 extends into termination area 300 but it may not extend into area 300 in other embodiments. The edge termination structure 305 includes several pillars or layers formed vertically in the semiconductor layer 330 (e.g., an epitaxy layer). The edge termination structure 305 can have various combinations of various conductivity types (e.g., N type, P type) for example NP-buffer-PN or NP-buffer-N pillars. In one embodiment, the buffer may be a dielectric or other material as indicated herein. The NP-buffer-PN, PN-buffer-NP, and NP-buffer-N pillar structures facilitate depletion. The depletion front, from the active region 310 reaches a first region 395 (e.g., a first N-type pillar) at a given applied voltage (e.g., 200V). As the applied voltage is increased (e.g., from 200V to 800V) the depletion front advances in the vertical direction while the lateral depletion of the first region 395 (e.g., N-type pillar) is a slower rate of depletion compared to the rate of depletion in the vertical direction. At a particular voltage (e.g., 800V) the first region 395 (e.g., N-type pillar) becomes depleted at the top and the depletion region extends to a junction between the first region 395 and a second region 390 (e.g., a P-type pillar). The depletion of the first region 395 extends from top to bottom (e.g., from a surface of the semiconductor layer 330 to a semiconductor substrate 340 such as an N+ substrate). When the first region 395 is depleting, the second region 390 can also be depleting. Note that discussions herein may refer to a layer or a region where a layer is a specific type of region, generally formed parallel to a surface. A region can be of any shape of formation. Thus, although some non-limiting examples discuss layers, the scope of such embodiments should be interpreted to extend to also include regions. Note that the termination structure (e.g., 305) can be operatively attached to the semiconductor-layer (e.g., 330), where operatively attached includes formed in and/or adjacent.

A buffer region or layer 380 (e.g., an insulator layer, an intrinsic layer, an oxide layer, a gas region, a dielectric layer, a void, or a combination of layers and regions) can be positioned between the second region 390 and a third region 370 (e.g., a P-type pillar). During the process of depletion, within the buffer region 380 the potential lines extend into the buffer region 380, Depending upon the voltage applied, the second region 390 (e.g., P-type pillar) can be partially depleted or completely depleted when the BV is reached. The buffer layer between the second 390 and third 370 regions (e.g., between the first P-type pillar and the second P-type pillar) facilitates laterally confining the potential lines in the buffer region 380 (e.g., a dielectric pillar).

In at least one embodiment, the third region 370 is a P-type region with an adjacent N-type region 360. The N-type region 360 is adjacent to another region 350 which has a different conductivity type from the semiconductor layer 330. Alternatively, region 350 can be an extension of semiconductor layer 330, and thus the same conductivity, in which the edge termination structure 305 has been formed. Note in the non-limiting examples discussed the regions (e.g., 395, 390, 370, 360) can have various conductivity types (e.g., N-type and P-type) which can be acquired by methods known by those of ordinary skill in the semiconductor fabrication, for example by doping. Note that one region (e.g., 395) can also be distinguished by another region (e.g., 390) by different values of conductivity.

In another embodiment, the area consumed by termination area 300 can be decreased in extent by having a highly doped concentration (e.g., N doped) of the third region 370, and thus facilitating a good electrical connection between the third region 370 and the semiconductor substrate 340 (e.g., N+ substrate).

Thus, it can be seen that at least one embodiment is directed to an NP-buffer-PN or a PN-buffer-NP pillar edge termination structure (regions 395-390-380-370-360), while at least another embodiment is directed to a NP-buffer-N pillar edge termination structure (1395-1390-1380-1370, see FIG. 13).

The effect of the potential drop into the buffer pillar facilitates keeping the die edge safe from, high electric fields. Additionally the edge termination structure partially sustains the voltage into the buffer pillar thus avoiding BV degradation. In at least one embodiment, the edge termination structure is coupled with a field plate, JTE and floating p-rings termination structures. However JTE and floating p-rings terminations structures show a more optimum potential distribution than the field plate termination structure embodiment. For a similar length of the termination area, the maximum 3V for the JTE is larger than that, for a field plate termination.

The first region 395 can provide a low resistance current path for the active region 310. In at least one embodiment, the first region 395 can be an N-type layer with a concentration on the order of about $6.0 \times 10^{16}$ atoms/cm$^3$. The second region 390 can be a P-doped layer, which provides better control of a PN junction between first region 395 and the second region 390, and provides charge compensation for the first region 395 under full depletion conditions. In at least, one embodiment, the second region 390 can be P doped with a concentration on the order of about $6.0 \times 10^{16}$ atoms/cm$^3$.

FIG. 13 illustrates a non-limiting example of a semiconductor device 1301 that includes an edge termination structure 1305 in accordance with at least one embodiment, Device 1301 includes a semiconductor substrate 1340, a semiconductor layer 1330, an active region 1310, and an edge termination structure 1305. Semiconductor substrate 1340 can be of a first conductivity type, for example an N+ conductive layer (e.g. doped to obtain an N+ conductivity). Semiconductor layer 1330 may be of the first conductivity type and a different value of conductivity (e.g., an epitaxial layer of N− doping) that may be formed overlying semiconductor substrate 1340. Active region 1310 can be formed in a portion of semiconductor layer 1330. Edge termination structure 1305 can also be formed in a second portion of semiconductor layer 1330. Edge termination structure 1305 facilitates depletion and the reduction of the electric field at the edge 307 of semiconductor device 1301. Edge termination structure 1305 comprises: a first region 1395, a second region 1390, a buffer region 1380 (e.g., an insulator layer, an intrinsic layer, an oxide layer, a gas region, a dielectric layer, or a combination of layers and regions), and a third region 1370. Regions 1395, 1390, and 1370 can be first or second conductivity types (e.g., N-type, P-type). Region 1390 can be formed adjacent to first region 1395. Buffer region 1380 can lie between second region 1390 and third region 1370, Regions 1395, 1390, 1370, and 1380 form edge termination structure 1305, which can be formed in semiconductor layer 1330 or adjacent to semiconductor layer 1330.

The various regions can be of various thicknesses as needed. For example, first region 1395 can be an N-type region or pillar which can have a thickness between about 0.1 and ten (10) microns, and more particularly between about 0.2 and two (2) microns. Region 1390 can be a P-type pillar which can have a thickness between about 0.1 and ten (10) microns, and more particularly between about 0.2 and two (2) microns. Buffer region 1380 can be between about 0.1 and ten (10) microns, and more particularly between about 0.1 and two (2) microns. Note that buffer region 1380 can include several types of layers of dielectrics and insulators. For example buffer region 1380 can include an oxide layer and a gas region. Buffer region 1380 and region 380 that is explained in the description of FIG. 3 may be similar to each other. Additionally, substrate 1340 and layer 1330 generally are similar to respective substrate 340 and layer 330 in FIG. 3.

As discussed previously, at least one embodiment is directed to an NP-buffer-N edge termination where the buffer region is a dielectric region. Note that although in the non-limiting examples discussed a first region 1395 can be referred to as an N-doped region, in other embodiments the various regions can be otherwise doped (e.g., P, N+, N−, P+). Thus instead of referring to a N-type pillar, a P-type pillar, or dielectric layers, reference is more general referring to doped regions. Such generality should be applied in interpreting the non-limiting examples discussed.

The non-limiting example illustrated in FIG. 13, illustrates the use of four layers (region or pillars) in the edge termination structure 1305. However embodiments can have numerous layers (regions or pillars) and are not restricted to any particular number.

Figure 4:
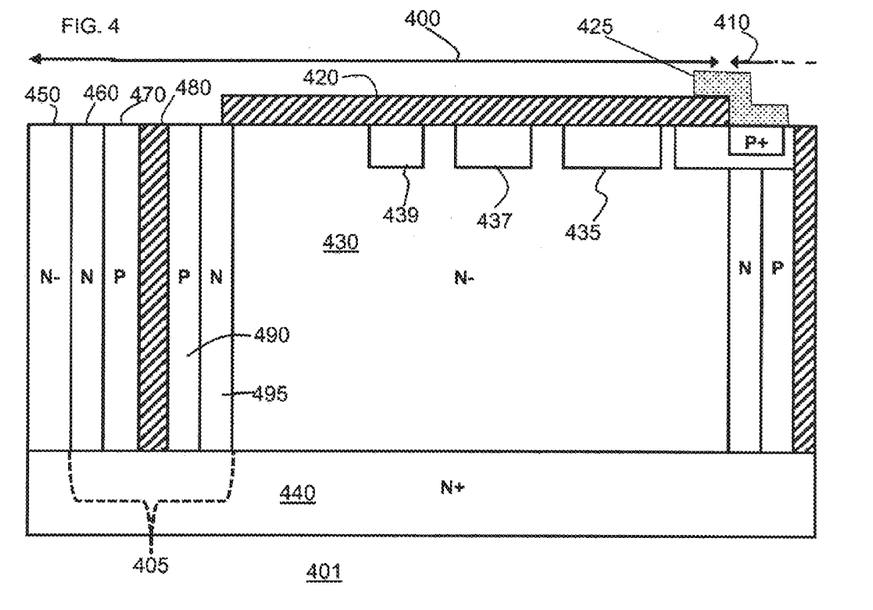
FIG. 4 illustrates a second non-limiting example of an edge termination structure in accordance with at least one embodiment of the present invention.

FIG. 4 illustrates a non-limiting example of a semiconductor device 401 that includes an edge termination structure 405 in accordance with at least one embodiment. Structure 405 may be similar to structure 305 that was explained in the description of FIG. 3. Device 401 also includes a semiconductor substrate 440, a semiconductor layer 430, and an active region 410. FIG. 4 illustrates the incorporation of P-ring structures in semiconductor layer 430 as illustrated by multiple P-ring structures (e.g., 439, 437, 435). Additionally, an optional dielectric plate 420 may also be operatively connected to active region 410 via a conductive source electrode 425. Note that the edge of the semiconductor device can include a layer 450 that can have a different conductivity type than that of the respective semiconductor layer 430. Additionally the layer 450 can also be a part of (e.g., formed in as opposed to formed adjacent to) the semiconductor layer 430, in which the edge termination structure was formed. Buffer region 480 may be similar to region 380 in FIG. 3. Additionally, substrate 440 and layer 430 generally are similar to respective substrate 340 and layer 330 in FIG. 3.

Figure 5:
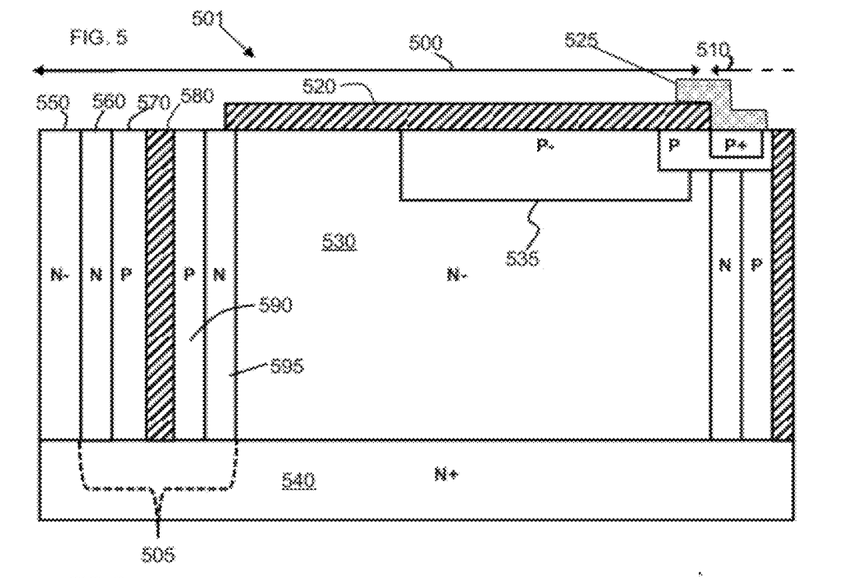
FIG. 5 illustrates a third, non-limiting example of an edge termination structure in accordance with at least one embodiment of the present invention.
Figure 6:
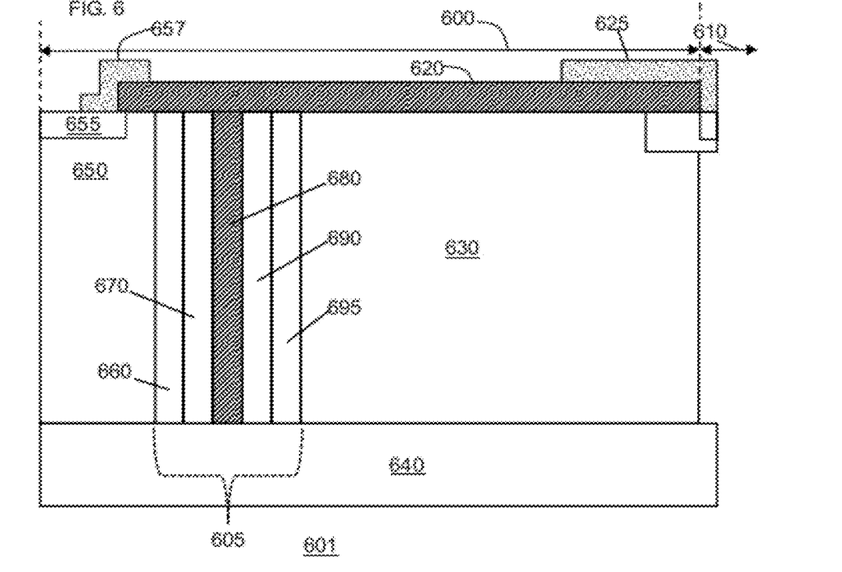
FIG. 6 illustrates a fourth non-limiting example of an edge termination structure in accordance with at least one embodiment of the present invention.

FIG. 5 illustrates a non-limiting example of a semiconductor device 501 that includes an edge termination structure 505 in accordance with at least one embodiment. Structure 505 may be similar to structures 305 and 405 that were explained in the description of respective FIGS. 3 and 4. Device 501 also includes a semiconductor substrate 540, a semiconductor layer 530, and an active region 510. FIG. 5 illustrates the incorporation of a P-ring structure in semiconductor layer 530 as illustrated by one P-ring structure 535. Additionally, an optional dielectric plate 520 may also be operatively connected to active region 510 via a conductive source electrode 525, Note that the edge of the semiconductor device can include a layer 550 that can have different a different conductivity type than that of the respective semiconductor layer 530. Additionally the layer 550 can also be a part of (e.g., formed in as opposed to formed adjacent to) the semiconductor layer 530, in which the edge termination structure 505 was formed.

Figure 9:
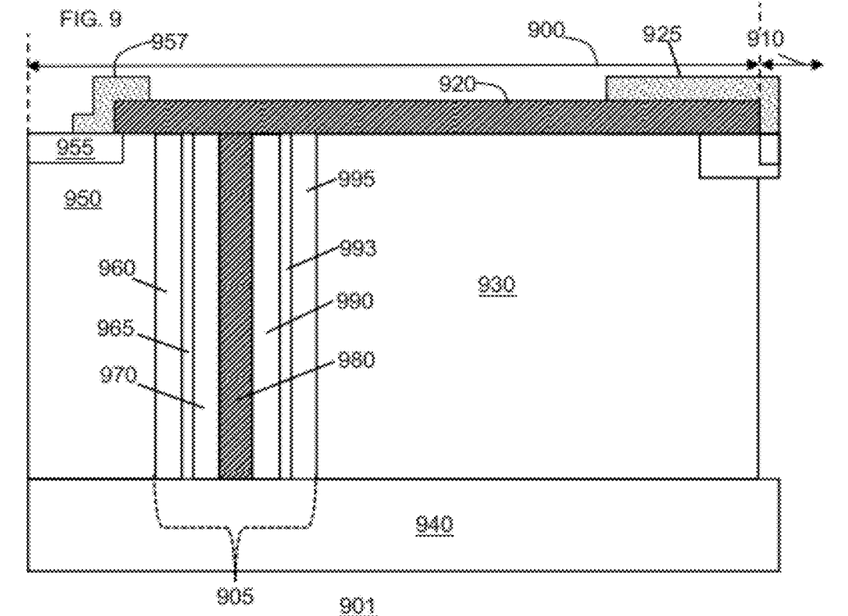
FIG. 9 illustrates a seventh non-limiting example of an edge termination structure in accordance with at least one embodiment of the present invention.

FIG. 9 illustrates a semiconductor device 901 that includes an edge termination structure 905. Structure 905 includes a first region 995 separated from a second region 990 by a separator layer 993 (e.g., an intrinsic layer and/or a dielectric layer). Note that the separator layer 993 can have variable thicknesses, for example between about, ten (10) nanometers and one (1) micron. Additionally the edge termination structure 905 can have multiple separator layers, for example third region 970 can be separated from fourth region 960 by separator layer 965. Alternatively, when edge termination structures are formed in trenches, the first and second separator layer can be a common layer, where the common layer can be formed from one or multiple layers in subsequent steps. For example, a common layer can be single layer deposited after the deposition of first region 995. A separator layer functions, among other things, to reduce the mixing of dopants, which improves the conduction efficiency of the edge termination structure 905. Thus, it can be seen that in at least one embodiment the regions may be separated by separator layers. Structure 905 and/or the separator layer(s) of structure 905 may be used in any of the edge termination structures explained in FIGS. 3-20 instead of the structures described therein or in addition to the structures described therein.

Figure 7:
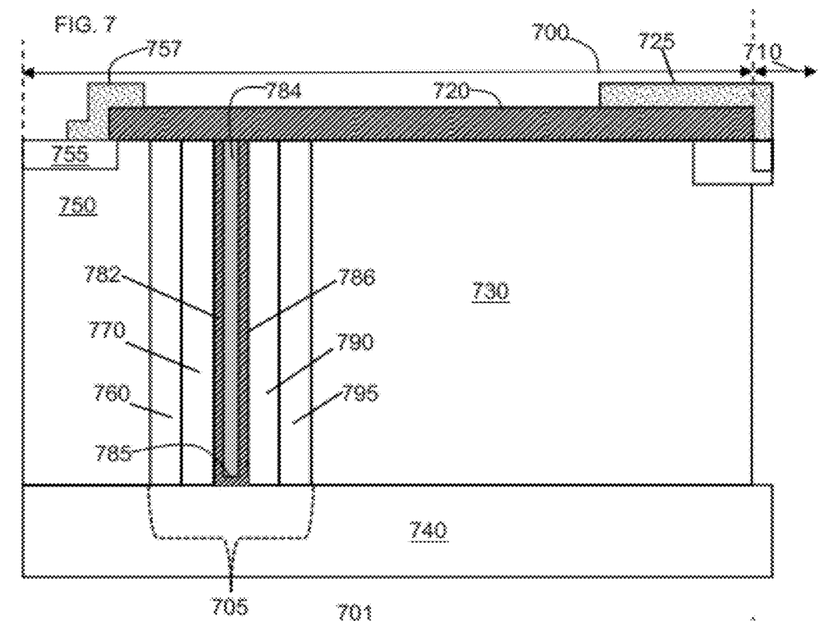
FIG. 7 illustrates a fifth non-limiting example of an edge termination structure in accordance with at least one embodiment of the present invention.

FIG. 7 illustrates a non-limiting example of a semiconductor device 701 that includes an edge termination structure 705 in accordance with at least one embodiment. A buffer region includes a dielectric layer 782, a gas region 784, and another dielectric layer 786. Note that the dielectric layers 782 and 786 can be formed from a single dielectric layer in a recess, in which case the layers 782 and 786 will be joined by a dielectric layer 785 at the bottom of the edge termination structure 705, where layers 782, 786 and 785 would be part of a single layer in a recess. The dielectric layers, 782, 785, and 786 can be oxide layers, intrinsic semiconductor layers, or other insulators as known by one of ordinary skill in the semiconductor device art. As illustrated in FIG. 7 the gas region 784 can be substantially enclosed by the three dielectric layers 782, 785, and 786. The gas can be a near vacuum, air, or other gas (including out gassing from the layers themselves). The dielectric layers 782, 785, and 786 can have a thickness of about ten (10) nanometers to about five (5) microns, and more particularly between about, fifty (50) nanometers and one (1) micron. The gas region can have a thickness of about 0.1 to ten (10) microns, and more particularly between about 0.2 and two (2) microns. Structure 705 and/or the buffer region of structure 705 may be used in any of the edge termination structures explained in FIGS. 3-20 instead of the structures described therein or in addition to the structures described therein, and can include multiple layers of dielectrics, intrinsic layers, and gas.

Figure 8:
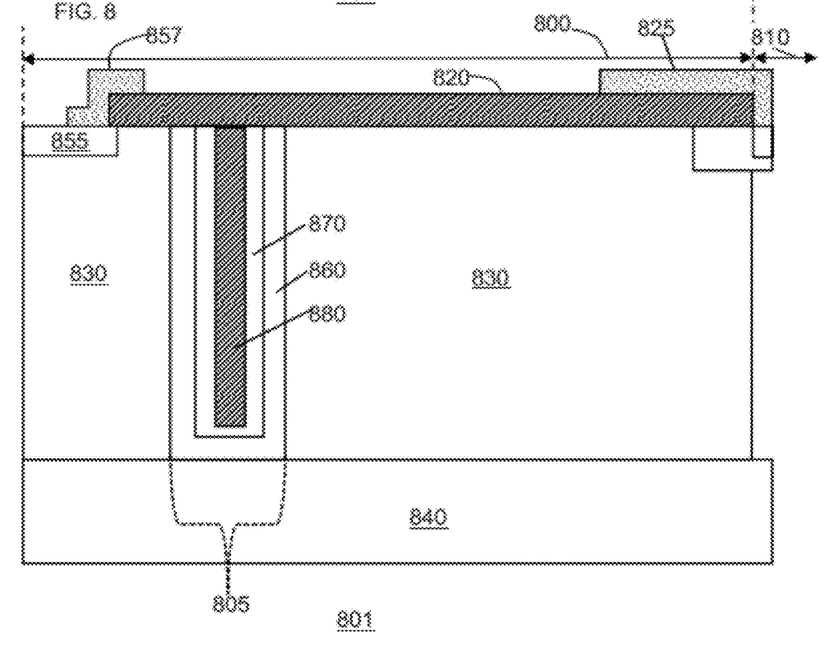
FIG. 8 illustrates a sixth non-limiting example of an edge termination structure in accordance with at least one embodiment of the present invention.

FIG. 8 illustrates a semiconductor device 801 that includes an edge termination structure 805 where a first layer 860 is formed in a trench or recess. For example, first layer 860 can be P-type material formed in a trench or recess. A second layer 870 can be formed in the remaining trench adjacent to first, layer 860. For example, second layer 870 can be N-doped. Then a buffer layer 880 can be formed in the remaining portion of the unfilled trench forming the edge termination structure 805. Structure 805 and/or the buffer region of structure 805 may be used in any of the edge termination structures explained in FIGS. 3-20 instead of the structures described therein or in addition to the structures described therein.

Figure 10:
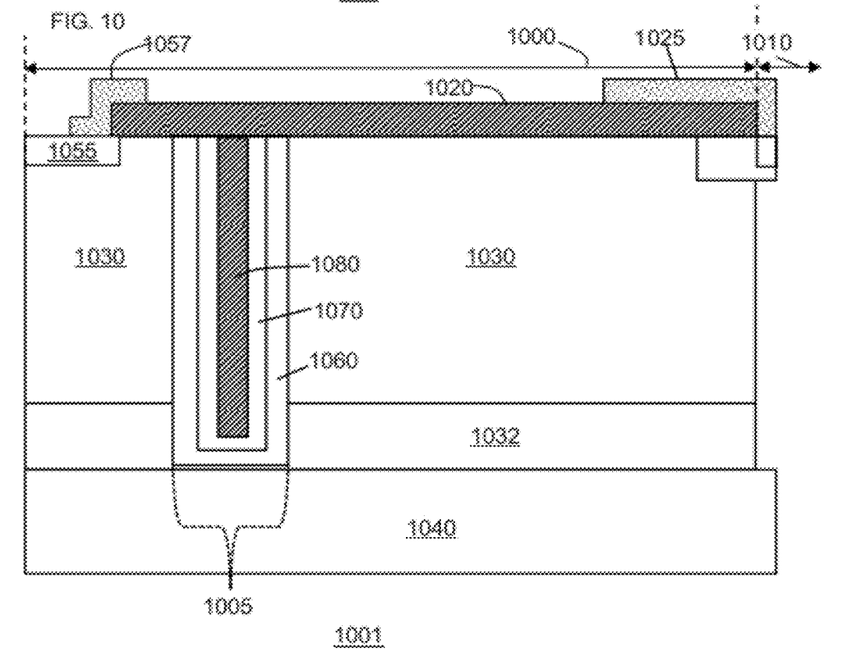
FIG. 10 illustrates an eighth non-limiting example of an edge termination structure in accordance with at least one embodiment of the present invention.
Figure 11:
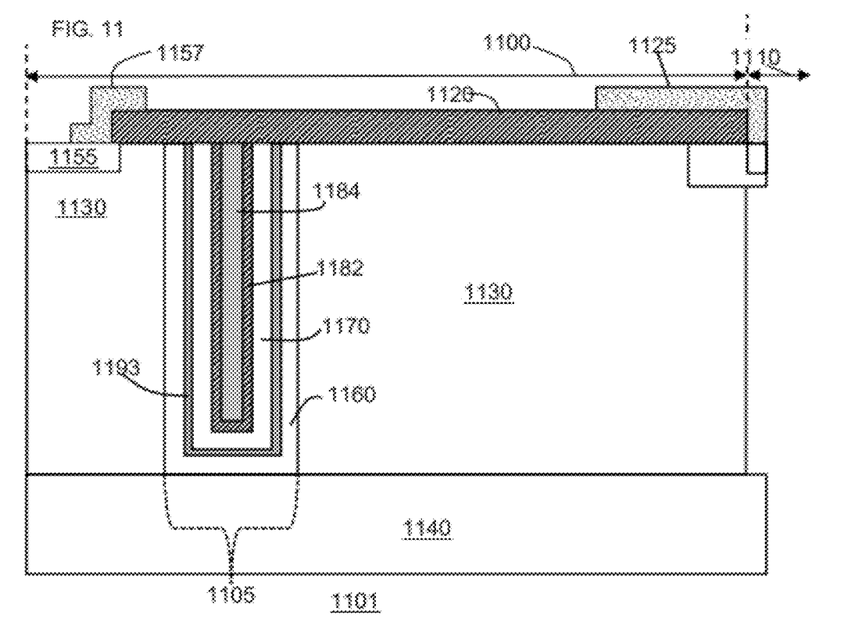
FIG. 11 illustrates a ninth non-limiting example of an edge termination structure in accordance with at least one embodiment of the present invention.
Figure 12:
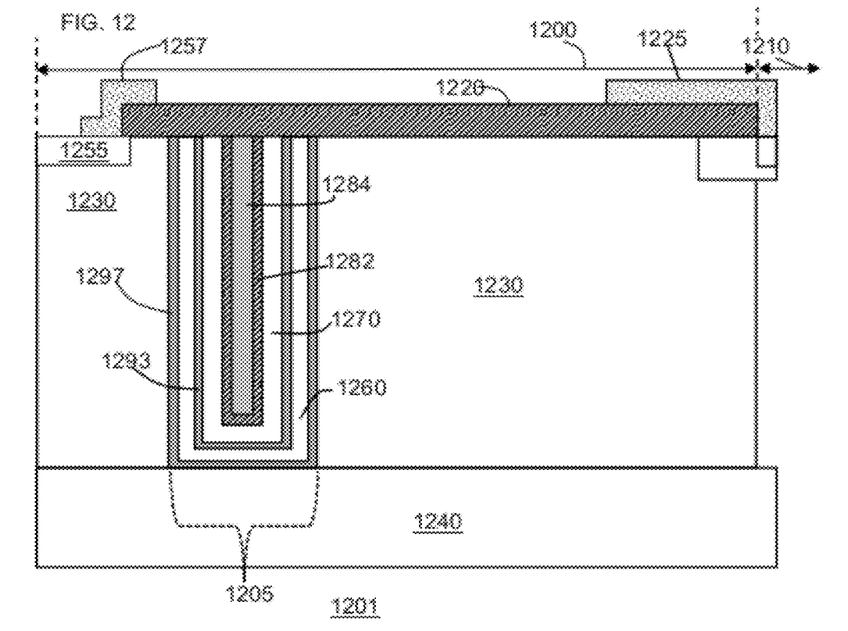
FIG. 12 illustrates a tenth non-limiting example of an edge termination structure in accordance with at least one embodiment of the present invention.

FIGS. 10, 11, and 12 additionally illustrate various embodiments of trench filled edge termination structures.

FIG. 10 illustrates a semiconductor device 1001 that includes an edge termination structure 1005, whose vertical extent terminates in a buffer layer 1032. Buffer layer 1032 has a doping concentration that is between the concentration of semiconductor layer 1030 and the semiconductor substrate 1040. Semiconductor substrate 1040 and semiconductor layer 1030 usually are similar to respective substrate 340 and layer 330 in FIG. 3. The buffer layer 1032 can be a thin layer between one (1) and one hundred (100) microns thick, and more particularly between about five (5) and twenty five (25) microns thick. FIG. 10 illustrates a similar edge termination structure as illustrated in FIG. 8; however, the vertical extent of the edge termination structure 1005 terminates in the buffer layer 1032. Note that the vertical extent of the various edge termination structures can vary, for example between about 0.1 and ten (10) microns. Those skilled in the art will appreciate that butter layer 1032 may be used in any of FIGS. 3-20.

FIGS. 11 and 12 illustrate respective semiconductor devices 1101 and 1201 that include edge termination structures 1105 and 1205, respectively. The edge termination structure 1205 illustrated, in FIG. 12 includes two separator layers 1297 and 1293, while edge termination structure 1105 illustrated in FIG. 11 includes a single separator layer 1193. The edge termination structure can be fabricated by successive formation of layers. For example, first region 1160 can be formed on, over, or adjoining trench walls formed in semiconductor layer 1130. Separator layer 1193 can be is formed on, over or adjoining first region 1160. Then second, region 1170 can be formed on, over or adjoining the separator layer 1193. The buffer region can be a combination of a dielectric layer 1182 and a gas region 1184. The dielectric layer 1182 can be formed on, over, or adjoining second, region 1170. The resulting edge termination structure 1105 can vary in extent vertically depending upon the initial trench depth and the thickness of the deposited layers. Note that separator layers (e.g., 1193, 1293, and 1297) can be intrinsic layers, insulation layers, and/or dielectric layers and the discussion herein should not be interpreted to limit the material the layers are made of or their material properties. Those skilled in the art will, appreciate that, termination structures 1105 and/or 1205 may be used in any of FIGS. 3-20.

Although non-limiting examples are discussed with single NP-buffer-PN structures, additional layers (e.g., variously N-doped and P-doped) can be used, and the additional layers can be optionally separated by separator layers. For example, FIG. 12 illustrates edge termination structure 1205 which includes separator layer 1297, a first region 1260, separator layer 1293, a second region 1270, and an oxide region 1282 substantially encompassing a gas region 1284. Note that the gas region can also be filled with a dielectric and thus the dielectric region 1282 and the gas region 1284 would be a single buffer region.

Note that the doped levels in embodiments can vary. For a non-limiting example, N doped and P doped regions can have concentrations on the order of about $1\times10^{13}$ to about $1\times10^{18}$ atoms/cm$^3$, and more particularly concentrations on the order of $1\times10^{15}$ to about $1\times10^{17}$ atoms/cm$^3$. Intrinsic layers are undoped or lightly doped regions (e.g., P-doped) with a dopant concentration less than about $2\times10^{14}$ atoms/cm$^3$. Additionally the intrinsic layer thickness can vary, for example between about fifty (50) nanometers and about two (2) microns. Additionally although the first and second conductivity types (N-type and P-type) can be obtained via doping, other methods as known by one of ordinary skill in the art of semiconductor fabrication can be used to obtain regions of various N and P conductivity types by other methods.

Thus it can be seen from the foregoing description of FIGS. 11-12 that at least one embodiment of an edge termination structure can be formed by filled trenches or discrete layers and can include multiple layers or stacked layers of semiconductor material formed using epitaxial growth techniques. Structures 1105 and/or 1205 and/or portions thereof may be used, in any of the edge termination structures explained in FIGS. 3-20 instead of the structures described therein or in addition to the structures described therein.

Figure 14:
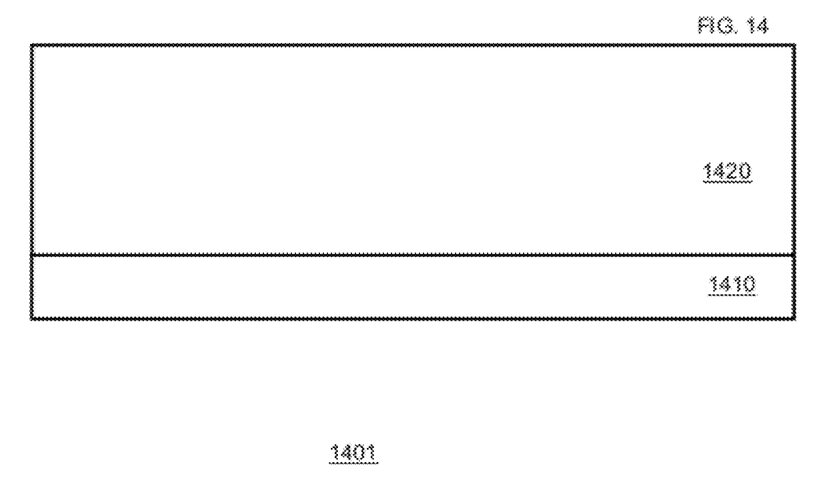
FIGS. 14-19 illustrate a non-limiting method of fabrication of an edge termination structure in accordance with at least one embodiment of the present invention.
Figure 15:
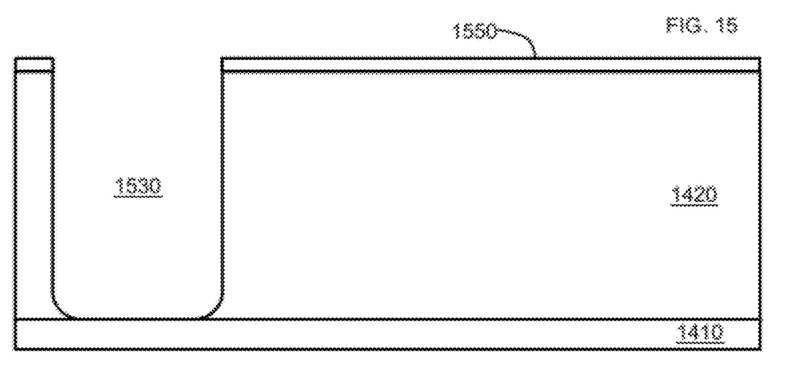
Figure 16:
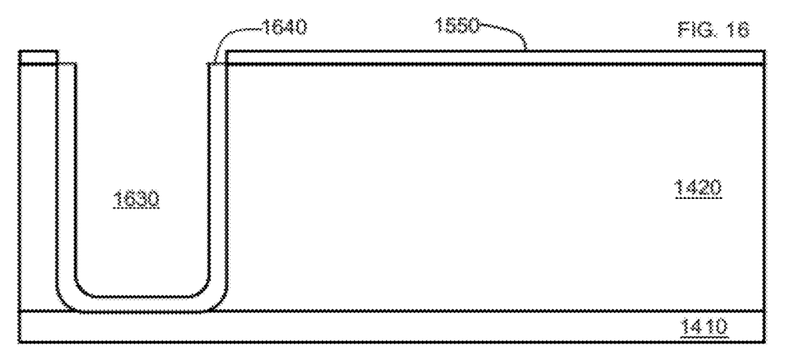
Figure 17:
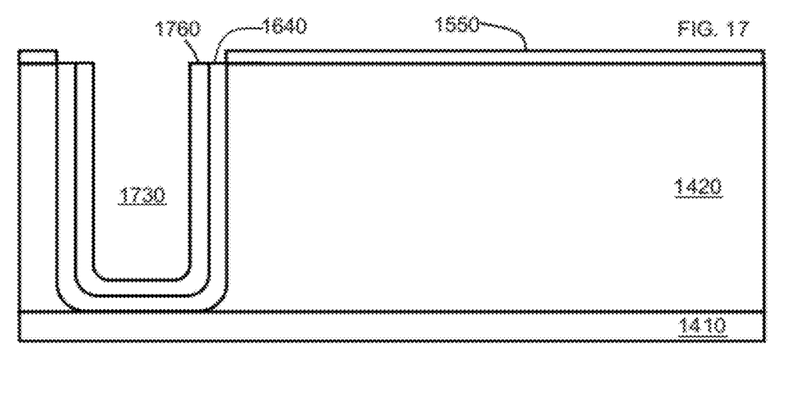
Figure 18:
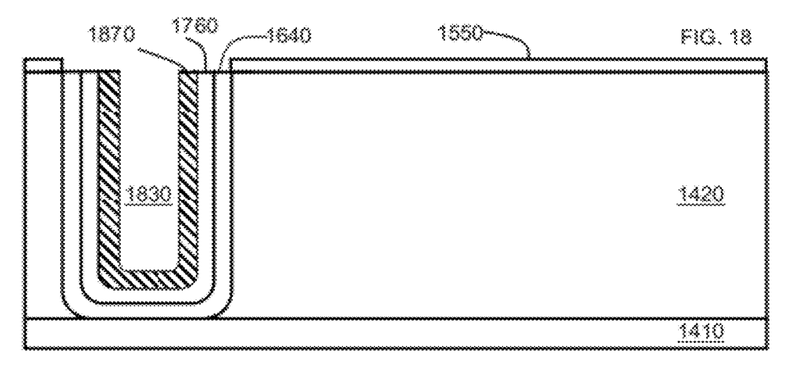
Figure 19:
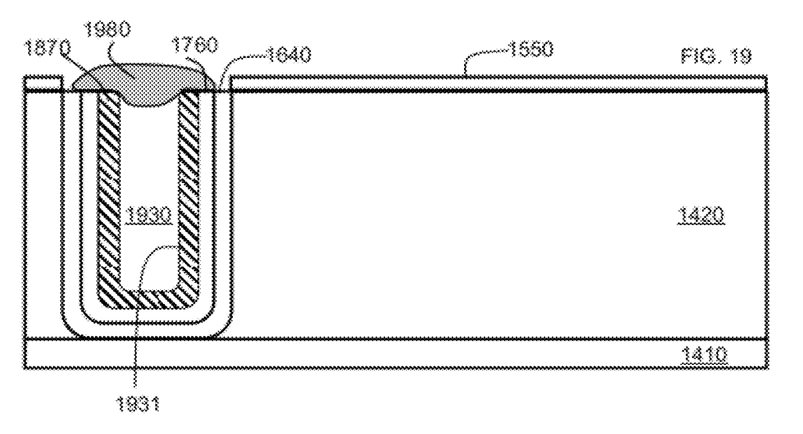

FIGS. 14-19 illustrate a process of formation of a semiconductor device 1401 having an edge termination structure in accordance with at least one embodiment. In some embodiments, the method used for forming semiconductor device 1401 can be used for forming any of devices 301, 401, 501, 601, 701, 801, 901, 1001, 1101, 1201, or 1301. Those skilled in the art will appreciate that the method steps explained in the description of FIGS. 14-19 are one example of a method and that variations of the method may be used. A doped semiconductor layer 1420 (e.g. N− doped epitaxy layer) can be formed on a doped (e.g., N+ doped) semiconductor substrate 1410 (FIG. 14). An additional dielectric layer 1550 can be formed on the surface of the semiconductor layer 1420. Substrate 1410 and semiconductor layer 1420 can be any of respective substrates 340, 440, 540, 640, 740, 840, 940, 1040, 1140, 1240, or 1340, and semiconductor layers 330, 430, 530, 630, 730, 830, 930, 1030, 1130, 1230, or 1330. Also, dielectric layer 1550 may be any of optional dielectric layers 320, 420, 520, 620, 720, 820, 920, 1020, 1120, 1220, or 1320.

A first recess 1530 (e.g., a first trench) can be etched, into the semiconductor layer 1420 and dielectric layer 1550 using known semiconductor etching techniques. The vertical extent of the trench can reach the semiconductor substrate 1410 or the semiconductor layer 1420 or into a buffer region (not shown). A doped layer first region 1640 can be formed on, over, or adjoining the surface of recess 1530, forming a recess 1630. Note that prior to forming doped region 1640, a separator layer (not shown) can be formed to separate first region 1640 from the semiconductor layer 1420. A second region 1760, such as a doped layer, can be formed on, over, or adjoining the surface of first region 1640 forming a recess 1730. Additionally a second separator layer (not shown) can be formed on first region 1640 prior to forming second region 1760 to separate first, region 1640 from second region 1760. A buffer region 1870 (e.g. dielectric layer, oxide layer, insulator layer, gas region, an intrinsic layer and/or a combination of such layers and regions) can be formed on, over, or adjoining the surface of second region 1760 forming a recess 1830. Recess 1830 can be a gas region or filled. Recess 1830 can be covered by a cap 1980 forming a recess region 1930, where the recess region 1930 (e.g., filled with gas) is substantially encircled or encompassed by a combination of the cap 1980 and recess walls 1931. Substantially encompassing a recess/trench includes covering greater than about ten per-cent (10%) of the surface area forming a recess/trench. The resultant structure is an edge termination structure including first region 1640, second region 1760, buffer region 1870, and gas region 1930.

Figure 20:
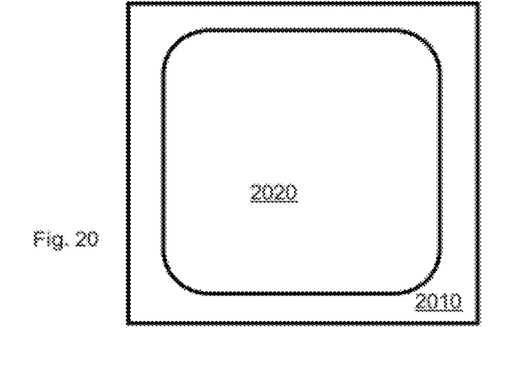
FIG. 20 illustrates an enlarged plan view of a portion of at least one embodiment of a semiconductor device that is formed on a semiconductor die in accordance with the present invention.

FIG. 20 illustrates an enlarged plan view of a portion of an embodiment of a semiconductor device 2020 that is formed on a semiconductor die 2010. A device 2020 may include any one of multiple of devices 301, 401, 501, 601, 701, 801, 901, 1001, 1101, 1201 and or 1301 which may be formed on die 2010 by semiconductor manufacturing techniques that are well know to those skilled in the art. Die 2010 may also include other circuits that are not shown in FIG. 20 for simplicity of the drawing. Device 2020 is formed on die 2010 by semiconductor manufacturing techniques.

While the present invention has been described with reference to embodiments, it is to be understood that the invention is not limited to the disclosed embodiments. The scope of the following claims is to be accorded the broadest interpretation so as to encompass all modifications, equivalent structures and functions.

Note that in the hereinbefore non-limiting discussions, for example the semiconductor device 501 illustrated in FIG. 5, the termination area (e.g., 500) and the active region (e.g., 510) are separated. However in at least one embodiment the edge termination structure (e.g., 505) can be formed in the active region and the discussion herein should not be interpreted to limit where the termination edge structure (e.g., 505) is formed.

The foregoing explanations describe, relating to FIGS. 3, 4, 5, and 6, edge termination structures 305, 405, 505, and 605 respectively, that have five layers, (e.g., FIG. 3 illustrates a termination structure 305 including regions 395, 390, 380, 370, and 360). Region 395 (e.g., likewise in FIGS. 4, 5, and 6, regions 495, 595, and 695 respectively) can be N-type, second region 390 (e.g., likewise in FIGS. 4, 5, and 6, regions 490, 590, and 690 respectively) can be P-type, the buffer region 380 (e.g., likewise in FIGS. 4, 5, and 6, regions 480, 580, and 680 respectively) can be a dielectric or intrinsic layer, third region 370 (e.g., likewise in FIGS. 4, 5, and 6, regions 470, 570, and 670 respectively) can be P-type and fourth region 360 (e.g., likewise in FIGS. 4, 5, and 6, regions 460, 560, and 660 respectively) can be N-type, forming a NP-dielectric-PN edge termination structure 305 (e.g., likewise in FIGS. 4, 5, and 6, edge termination structures 405, 505, and 605 respectively). Note that the conductivity type and the value of the conductivity (P-type, N-type, N-type lowly doped (N−), N-type more heavily doped (N+)) can vary and discussion herein are with regards to non-limiting examples, thus for example the first region 395 (e.g., likewise in FIGS. 4, 5, and 6, regions 495, 595, and 695 respectively) can be P-type.

As previously mentioned the edge termination structure of embodiments can be used with ring and plate systems. FIG. 4 and FIG. 5 illustrate the incorporation of P-ring structures in the semiconductor layer 430 (FIG. 4) and semiconductor layer 530 (FIG. 5). FIG. 4 illustrates multiple P-ring structures (e.g., 439, 437, 435), while FIG. 5 illustrates one P-ring structure (e.g., 535). Additionally FIGS. 3-13 illustrate the optional use of a dielectric plate (e.g., 320, 420, 520, 620, 720, 820, 920, 1020, 1120, 1220 and 1320), operatively connected to respective active regions (e.g., 310, 410, 510, 610, 710, 810, 910, 1010, 1110, 1210, and 1310) via a conductive source electrode (e.g., 325, 425, 525, 625, 725, 825, 925, 1025, 1125, 1225, and 1325). The dielectric plates can optionally be operatively connected to the edge of the semiconductor layer via N+ contact, regions (e.g., 655, 755, 855, 955, 1055, 1155, 1255, and 1355) where the N+ contact regions are coupled to the plate via edge electrodes (e.g., 657, 757, 857, 957, 1057, 1157, 1257, and 1357), Note that the edge of the semiconductor device can include a layer (e.g., 350, 450, and 550) that can have a different conductivity type than that of the respective semiconductor layer (e.g., 330, 430, and 530). Additionally the layers 350, 450, and 550 can also be a part of (e.g., formed in as opposed to formed adjacent to) the semiconductor layer 330, 430 and 530 respectively, in which the edge termination structure was formed. Note that the contact regions (e.g., 655) can extend to the doped region closest to the contact region (e.g., 660) and to other doped regions beyond (e.g., 670, 680).

It can be seen from all the foregoing, that in at least one embodiment, the vertical structure of the edge termination structure (e.g., 305, 405, 605, 705, 805, 905, 1105, 1205, and 1305) can be of various extent, for example the vertical extent of the edge termination structure can reach to the semiconductor substrate layer (e.g., 340, 440, 540, 640, 740, 840, 940, 1140, 1240, and 1340). Additionally at least, one embodiment, has an edge termination structure whose vertical extent does not penetrate to the semiconductor substrate layer.

In view of the above, it is evident that a novel device and method, is disclosed that can, in at least one embodiment, have a reduced termination area while minimizing E-field line termination at the edge of the die edge, additionally providing lower RS, and a high BV.

As the claims hereinafter reflect, inventive aspects may lie in less than all features of a single foregoing disclosed embodiment. Thus, the hereinafter expressed claims are hereby expressly incorporated into this Detailed Description of a non-limiting sample of embodiments, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art. Such variations are not to be regarded as a departure from the spirit and scope of the present invention.

The invention claimed is:

1. A semiconductor device comprising:
   a semiconductor substrate of a first conductivity type;
   a first layer of the first conductivity type formed overlying the semiconductor substrate, the first layer having a surface;
   the semiconductor device including an active region and an edge termination area wherein the edge termination area is external to the active region; and
   an edge termination structure within the edge termination area, the edge termination structure including:
   a first region,
   a second region, where the second region has a different conductivity type than the first region and where the second region is adjacent to the first region,
   a first buffer region adjacent to the second region, the first buffer region having a length that extends in a first direction away from the surface of the first layer and having a width along the length wherein the first buffer region does not extend laterally in a second direction to overlie one of the first region or the second region;
   a third region formed adjacent to the first buffer region wherein the third region is a semiconductor material, the third region having a first surface in a plane substantially parallel to the surface of the first layer and wherein the first buffer region is disposed between the second region and the third region, where the edge termination structure is adjacent to the first layer and where the edge termination structure overlies the semiconductor substrate; and a dielectric layer on and in direct contact with the first surface of the third region, the dielectric layer extending onto and in direct contact with the second region.

2. The semiconductor device according to claim 1, where the first region and the third region are N-type.

3. The semiconductor device according to claim 1 where the edge termination structure further comprises:

a fourth region, where the fourth region has a different conductivity type than the third region and where the fourth region is formed adjacent to the third region.

4. The semiconductor device according to claim 3, where the first region is N-type and where the third region is P-type.

5. The semiconductor device according to claim 3 where the first buffer region comprises at least one of a gas region, or an insulating layer.

6. The semiconductor device according to claim 5, where the first buffer region comprises an insulator having at least one void.

7. The semiconductor device according to claim 6, where the at least one void includes air.

8. The semiconductor device according to claim 3 further comprising:

a first separator layer between the first region and the second region where the first separator layer is at least one of an intrinsic layer or a dielectric layer.

9. The semiconductor device according to claim 8 further comprising a second separator layer between the third region and the fourth region where the second separator layer is at least one of an intrinsic layer or a dielectric layer.

10. The semiconductor device according to claim 3, where the first region is p-type, where the second region is n-type, where the third region is n-type, and where the fourth region is p-type.

11. The semiconductor device of claim 1 wherein the third region is substantially parallel to one of the first region or the second region.

12. The semiconductor device of claim 1 wherein the width of the first buffer region is substantially no greater than a width of another buffer region formed in the active area of the semiconductor device wherein an edge of the active area borders the termination area.

13. The semiconductor device of claim 1 wherein the first buffer region does not extend in a second direction for a second distance that is greater than the width wherein the second direction is substantially parallel to the semiconductor substrate.

14. The semiconductor device of claim 1 wherein the third region has the different conductivity type.

15. The semiconductor device of claim 1 wherein the edge termination area is adjacent to the active region and is disposed between the active region and an edge of the semiconductor device.

* * * * *